(12) United States Patent
Compter et al.

(10) Patent No.: US 7,948,122 B2
(45) Date of Patent: May 24, 2011

(54) DISPLACEMENT DEVICE

(75) Inventors: Johan Cornelis Compter, Eindhoven (NL); Petrus Carolus Maria Frissen, Eindhoven (NL); Jan Van Eijk, Eindhoven (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 314 days.

(21) Appl. No.: 11/814,003

(22) PCT Filed: Jan. 10, 2006

(86) PCT No.: PCT/IB2006/050088
§ 371 (c)(1),
(2), (4) Date: Jul. 16, 2007

(87) PCT Pub. No.: WO2006/075291
PCT Pub. Date: Jul. 20, 2006

(65) Prior Publication Data
US 2008/0203828 A1    Aug. 28, 2008

(30) Foreign Application Priority Data
Jan. 17, 2005  (EP) .................................. 05100237

(51) Int. Cl.
*H02K 41/00* (2006.01)
*G03F 7/20* (2006.01)
(52) U.S. Cl. ............... 310/12.06; 310/12.22; 310/12.25; 310/12.27; 310/13; 414/935
(58) Field of Classification Search ............... 310/12–17
See application file for complete search history.

(56) References Cited

U.S. PATENT DOCUMENTS

| 6,208,045 | B1 | | 3/2001 | Hazelton et al. |
| 6,265,839 | B1 | * | 7/2001 | Layton .......................... 318/115 |
| 6,452,292 | B1 | * | 9/2002 | Binnard ...................... 310/12.06 |
| 6,531,793 | B1 | * | 3/2003 | Frissen et al. .............. 310/12.06 |
| 7,170,241 | B1 | * | 1/2007 | Faizullabhoy et al. ....... 318/135 |
| 2003/0169412 | A1 | * | 9/2003 | Hazelton ......................... 355/72 |
| 2004/0126907 | A1 | * | 7/2004 | Korenaga ........................ 438/10 |

FOREIGN PATENT DOCUMENTS

| DE | 3635401 | A1 | | 4/1988 |
| EP | 1347336 | | * | 9/2003 |
| EP | 1434335 | A2 | | 6/2004 |
| WO | WO9849763 | A2 | | 11/1998 |
| WO | WO0118944 | A1 | | 3/2001 |

\* cited by examiner

*Primary Examiner* — Burton Mullins
(74) *Attorney, Agent, or Firm* — Larry Liberchuk

(57) ABSTRACT

Especially for use in the semiconductor industry, a displacement device (701) is disclosed comprising a first part comprising a carrier (714) on which a system of magnets (710) is arranged according to a pattern of row and columns extending parallel to the X-direction and the Y-direction, respectively. The magnets in each row and column are arranged according to a Halbach array, i.e. the magnetic orientation of successive magnets in each row and each column rotates 90° counter-clockwise. The second part comprises an electric coil system (712) with two types of electric coils, one type having an angular offset of +45°, and the other type having an offset of −45° with respect to the X-direction. The first part (714, 710) is movable over a range of centimeters or more with respect to the stationary second part (712). For high precision positioning of the first part, an interferometer system (731, 730) is provided.

11 Claims, 10 Drawing Sheets

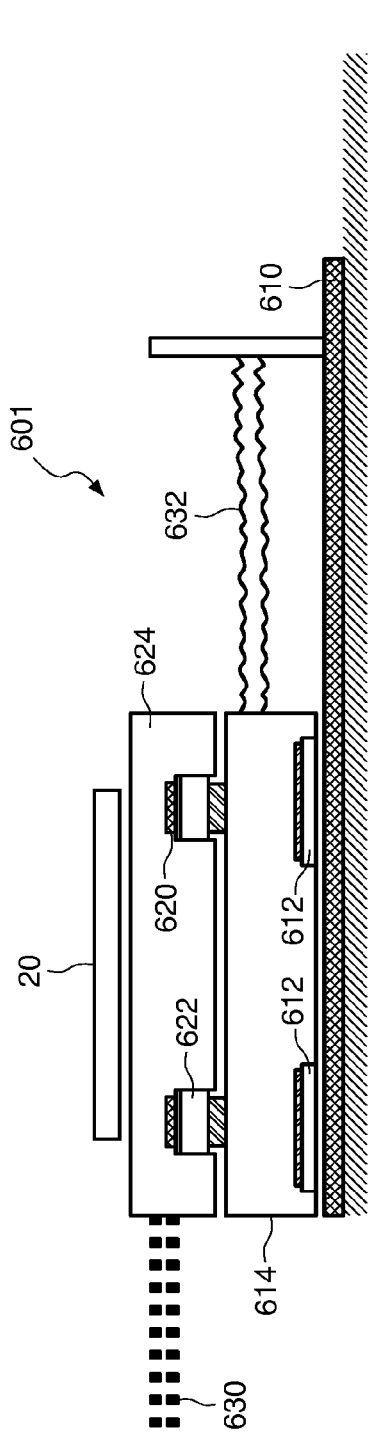
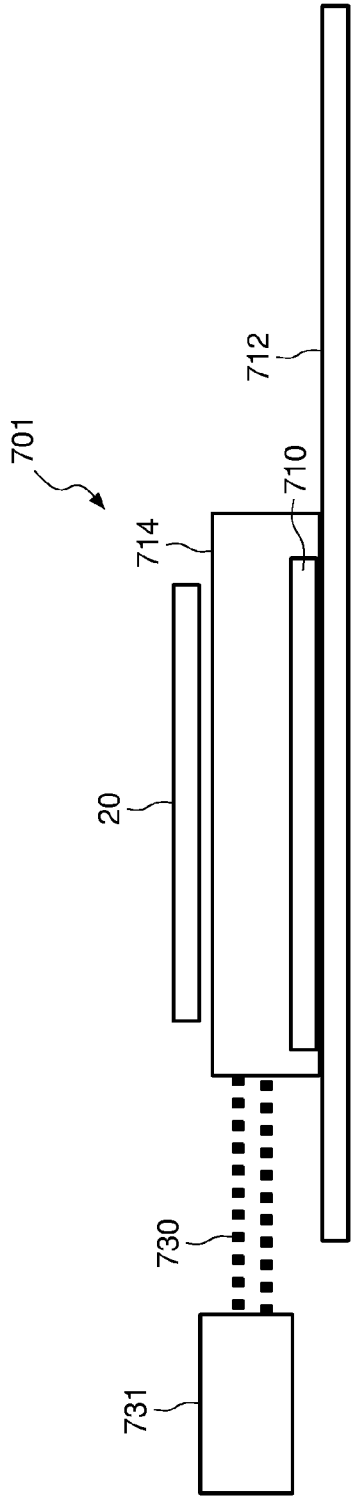
FIG. 6 PRIOR ART
FIG. 7

DISPLACEMENT DEVICE

The present invention relates to a displacement device for use in an electric planar motor, for example for the semiconductor industry.

Planar electric motors for the semiconductor industry need to have high accelerations to achieve a high throughput. One way to achieve high accelerations is to increase the magnetic field.

WO 01/18944 A1 discloses a positioning device comprising a first part comprising a carrier on which a system of magnets is arranged according to a pattern of row and columns extending parallel to the X-direction and the Y-direction, respectively. The magnets in each row and column are arranged according to a Halbach array, i.e. the magnetic orientation of successive magnets in each row and each column rotates 90° counter-clockwise. The second part comprises an electric coil system with two types of electric coils, one type having an angular offset of +45°, and the other type having an offset of −45° with respect to the X-direction, and is movable with respect to the first part. The magnet configuration causes a very strong magnetic field.

WO 01/18944 A1 is hereby incorporated by reference to be understood in connection with the present invention.

It is an object of the present invention to improve the displacement device disclosed in WO 01/18944 A1 with respect to ease of handling.

Accordingly, a displacement device is provided comprising a first part and a second part which can be displaced with respect to each other in at least an X-direction and a Y-direction perpendicularly thereto, the first part comprising a carrier which extends substantially parallel to the X-direction and the Y-direction and on which a system of magnets is secured in accordance with a pattern or rows extending parallel to the X-direction, and columns extending parallel to the Y-direction, an equal distance being present between the rows and between the columns, and magnets of a first type, having a magnetization direction which extends at right angles to the carrier and towards the second part, and magnets of a second type, having a magnetization direction which extends at right angles to the carrier and away from the second part, being alternately arranged in each row and in each column, and a magnet of a third type being arranged in each column between each pair of juxtaposed magnets of the first and the second type, which magnet of a third type has a magnetization direction which extends parallel to the Y-direction and towards the magnet of the first type, while the second part is provided with an electric coil system comprising at least one electric coil of a first type which has current conductors which are situated in a magnetic field of the system of magnets and which include an angle of substantially 45° with the X-direction, and comprising at least one electric coil of a second type, which has current conductors which are also situated in the magnetic field of the system of magnets and which include an angle of substantially 45° with the X-direction, and said current conductors extending perpendicularly to the current conductors of the first electric coil, wherein in each row of the magnets of the first part, also a magnet of the third type is arranged between each pair of juxtaposed magnets of the first and the second type, which magnet of the third type has a magnetization direction extending parallel to the X-direction and towards the magnet of the first type, the displacement device being characterized in that the second part is stationary and the first part is movable relatively to the second part over a range of centimeters or more and in that it further comprises an interferometer system for accurate positioning of the movable first part.

Moving the first, i.e. magnet part instead of the second, i.e. coil part has several advantages. No hoses and wires need to be attached to the moving part, as only the coils have to be supplied with current and be cooled. The coil part being stationary, cooling is easier to implement. The wires and hoses can be provided in a space separated from the region of interacting magnetic fields and currents and do not lead any more to dynamic disturbances. This improves the inherent accuracy of the positioning.

The movement of the magnet part being free of any restrictions like cables and hoses, the displacement device provides for quasi unlimited range of movement with still high accuracy in positioning, the inherent accuracy due to no cables on the moveable part being improved by the interferometer system for precise position measurement. The fact of having the magnet part moving over long as well as short ranges allows for single-stage configurations, instead of the more complex dual-stage configuration normally used, having a long stroke stage and a short stroke stage.

As is well known by the person skilled in the art, interferometry allows to measure differences in length down to the order of nanometers by analyzing the interference pattern of two light beams. A standard interferometer system comprises a light source, one or more optical elements such as e.g. mirrors or prisms, to condition the light beams and generate different paths, as well as a detector for measuring the interference pattern.

During the very sensitive lithography processes, it is an advantage that the magnet part is moving and carrying the wafer, as the magnets do not generate heat like the coils and, thus, do not induce thermal stress in the wafer.

A further improvement of the displacement device is achieved in that the magnets of the first and the second type have an identical square shape with side faces, in that the magnets of the third type are rectangular in shape with side faces, whereby the longest side faces of a magnet of the third type border on the side faces of a magnet of the first and the second type and are just as long as the side faces of the magnet of the first and the second type. Preferably, the ratio of the dimension of the shortest side face of a magnet of the third type to the dimension of the longest side face ranging between 0.25 and 0.50. It has been found that this configuration of magnets yields an even stronger magnetic field.

It is further advantageous, if the length of the current conductors of the coils, which current conductors are situated in the effective magnetic field, is approximately equal to k times the pole pitch of the magnets, with k being 2, 4, 6, . . . , and the pole pitch of the magnets being defined as the distance between two adjacent diagonal lines on which center points of magnets of the first and second type are situated. A movement in the longitudinal direction of the current conductors causes the sum of the magnetic field to remain substantially constant, as a result of which fluctuations in the strength are reduced.

In preferred embodiments of the present invention, the first part comprises a return plate of a height of ca. 5 mm or less, preferably ca. 3 mm or less. Return plates are the located directly on the back of magnet systems. They are made of ferromagnetic material and have the function of returning the magnetic flux into the magnets. In case of using magnets of the third type H, also called Halbach magnets, between the magnets of first and second type, the flux does not extend as far outside the magnets of first and second type as without magnets of the third type. This allows for much thinner return plates as normal, it allows even for having no return plate at all. This reduces the weight of the displacement device and increases its energy efficiency.

In preferred embodiments, the coil height is between ca. 5 mm and 30 mm, preferably between ca. 9 mm and 23 mm. These embodiments have been optimized for use in wafer steppers and provide a combination of high forces and high steepness, steepness being the square of the force per power loss.

It has proven to be advantageous to place a Hall sensor array in the middle of a coil. Hall sensor arrays are very convenient for measuring the magnetic flux. From these measurements the position of the magnet part with respect to the coil part can be determined. Based on the information of at least two Hall sensor arrays, it is determined what current level should be given to which coil. By placing a Hall sensor array in the middle of a coil, the Hall sensor array is placed as near as possible to the magnets for optimal accuracy of the measurement, without extra need for space.

Preferably, a component of the interferometer system is a mirror and/or a prism on a vertical side of the first part for reflecting a light beam of the interferometer system. Whether to choose a mirror and/or a prism as well as their number depends on the actual geometry.

It is advantageous to provide means for wireless communication on the magnet part, in case measured data or control signals have to be exchange, e.g. data concerning holding means for the objects to be transported or calibration means. Preferred communication means are e.g. optical or capacitive. Wireless energy transfer can be applied for electrostatic clamping of the transported object. Also rechargeable battery can be applied.

Preferably, the magnet part comprises a pick-up coil. A pick-up coil can be used for picking up power for any electronic components located on or in the magnet part, or for sending signals or for picking up signals.

In preferred embodiments, the device comprises more than one first part, i.e. magnet part to be moved with respect to the second part, i.e. coil part. Such configurations are particularly useful, if several objects have to be transferred successively to several positions at the same time.

In a further aspect of the present invention, the displacement device is used in a planar electric motor with six degrees of freedom, as are utilized for example in object stages.

A detailed description of the invention is provided below. Said description is provided by way of a non-limiting example to be read with reference to the attached drawings in which:

BRIEF DESCRIPTION OF THE DRAWINGS

FIG. 6 is a cross-sectional view of a displacement device according to prior art;

FIG. 7 is a cross-sectional view of a displacement device according to the invention;

DETAILED DESCRIPTION OF THE INVENTION

Figure 1:
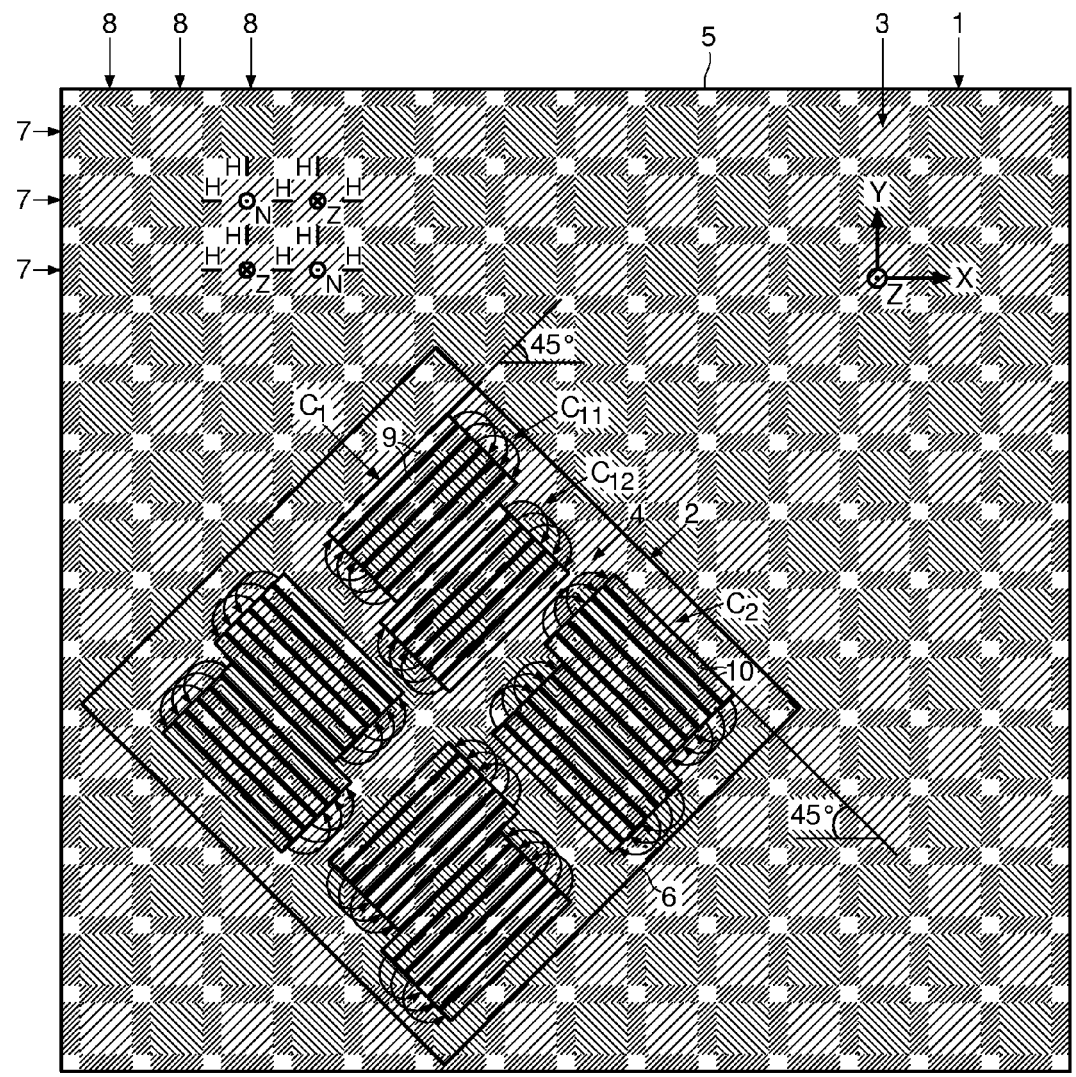
FIG. 1 is a diagrammatic plan view of the displacement device according to prior art comprising the system of magnets and the electric coil system.

FIG. 1 diagrammatically shows a displacement device as described in WO 01/18944 A1 comprising a first part 1 formed by a system 3 of magnets, and a second part 2 formed by an electric coil system 4. The magnets are secured onto a carrier 5 and the coil system is secured onto a coil block 6. The first and the second part can move with respect to each other. In the example illustrated in FIGS. 1 to 3, the stationary part is formed by the carrier 5 with the magnets, and the movable part is formed by the coil block 6. For the displacement device according to the invention, a similar configuration of the magnet system 3 is used and the basic principles of interaction between first and second part are the same.

The magnets are arranged on the carrier 5 in the manner described hereinafter: The magnets are arranged in a pattern of rows 7 extending parallel to the X-direction, and columns 8 extending parallel to the Y-direction, the interspace between the rows and between the columns being the same. In each row 7 and in each column 8, magnets of a first type N and of a second type Z are alternately arranged. The magnets of the first type N have a direction of magnetization which extends at right angles to the carrier and towards the second part with the electric coil system, while the magnets of the second type Z have a direction of magnetization which extends at right angles to the carrier and away from the second part with the electric coil system. In each row and in each column, a magnet of a third type H is arranged between each pair of magnets of the first type N and the second type Z. The direction of magnetization of the magnets of the third type H which are situated between the columns 8, extends parallel to the Y-direction and towards the adjacent magnet of the first type N, while the direction of magnetization of the magnets of the third type H which are situated between the rows 7, extends parallel to the X-direction and also towards the adjacent magnet of the first type N. The directions of magnetization of the different types of magnets N, Z and H are indicated by means of arrows.

The electric coil system 4 is provided with at least one coil of a first type $C_1$ whose current conductors 9, which are situated in the effective magnetic field of the magnets, include an angle of 45° with the X-direction, and said electric coil system is also provided with at least one coil of a second type $C_2$ having current conductors 10, which are also situated in the effective magnetic field of the magnets, include an angle of 45° with the X-direction, and extend perpendicularly to the current conductors 9 of the coil of the first type $C_1$. The expression "current conductors in the effective magnetic field", is to be taken to mean that that part of the coil, generally a bunch of current conductors, is situated in the magnetic field of the magnets, and that an effective Lorentz force is exerted on said part, causing a movement of the coil.

The manner in which the coils move in the system of magnets will be explained hereinafter with reference to FIG. 2. The reference numerals $9_1$, $9_2$ and $10_1$, $10_2$ represent current conductors of the coils $C_1$ and $C_2$, respectively, which are provided in the magnetic fields of the magnets. Current conductor $9_1$ is situated predominantly in the magnetic fields of the magnets indicated by means of the letter N. The direction of magnetization of these N magnets is indicated by means of an arrow pointing upwards, i.e. directed at right angles to the system of magnets and towards the current conductor $9_1$. The direction of the magnetic field is indicated by means of the arrow $B_1$. If an electric current flows through the current conductor $9_1$ in the direction indicated by the arrow $I_1$, a force $F_1$ will be exerted on the current conductor in the direction indicated by the relevant arrow, as a result of which the current conductor wants to start moving in the direction of the arrow $F_1$. Current conductor $9_2$ is predominantly situated in the magnetic fields of the magnets referenced Z. The direction of magnetization of these Z magnets is indicated by means of an arrow $B_2$ which points downwards, i.e. at right angles to the system of magnets and away from the current conductor $9_2$. If an electric current flows through the current conductor $9_2$ in accordance with the arrow $I_2$, i.e. it runs counter to the current $I_1$, a force $F_2$ in the direction indicated by the relevant arrow will be exerted on the current conductor $9_2$, as a result of which the current conductor wants to start moving in the direction indicated by the arrow $F_2$, i.e. in the same direction as the arrow $F_1$. In the same manner, the current conductors $10_1$ and $10_2$, which are arranged at right angles to the current conductors $9_1$ and $9_2$, will be subject to a force extending in the direction indicated by the arrows $F_3$ and $F_4$, under the influence of the magnetic fields of the N and Z magnets at a current in accordance with the arrows $I_3$ and $I_4$. Of course, if the currents in the current conductors are reversed, the force exerted on, and hence the movement of the current conductors, will also be reversed. In FIG. 3, this interplay of forces is also shown.

Figure 2:
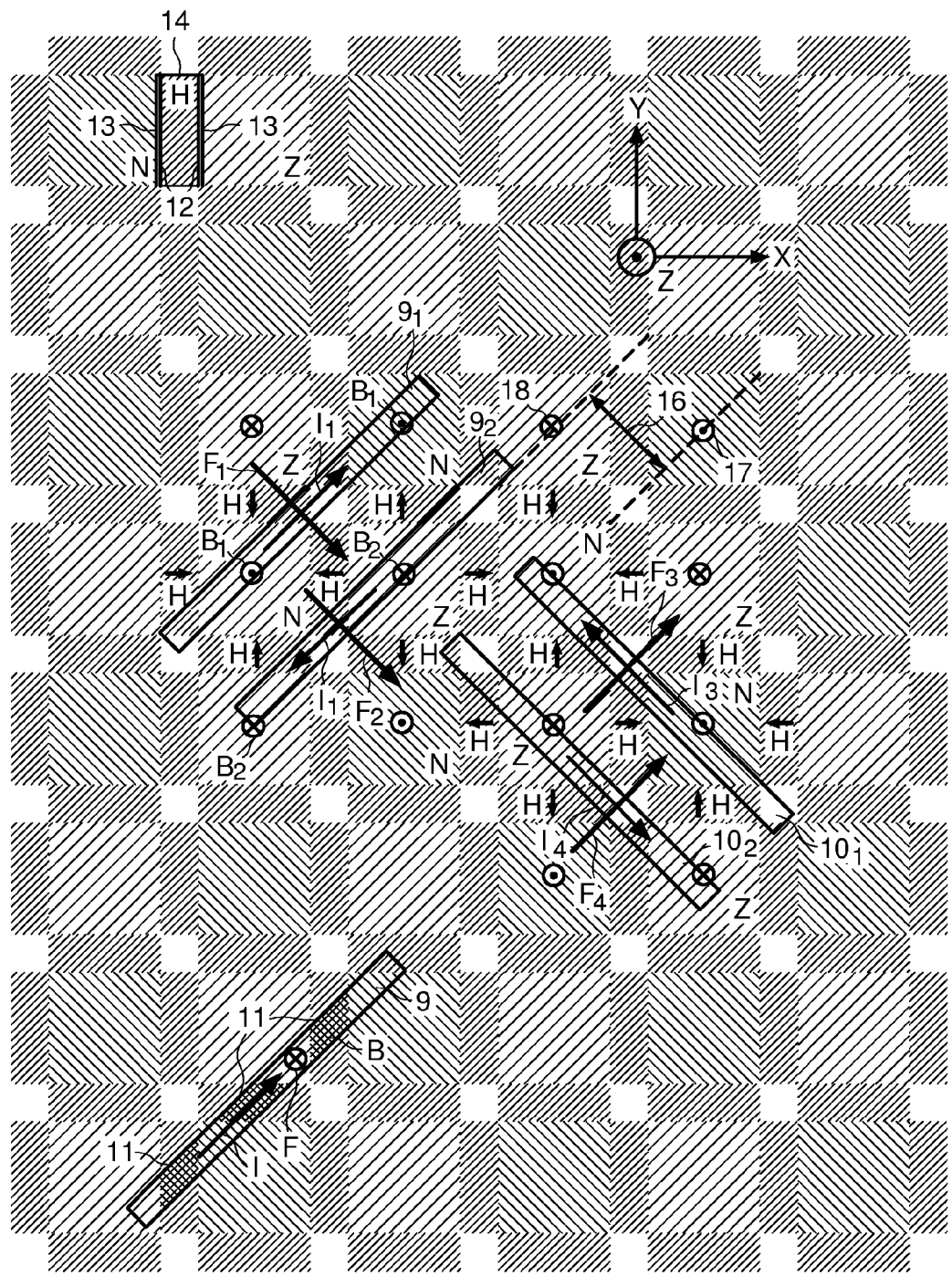
FIG. 2 is a detailed plan view of FIG. 1.
Figure 3:
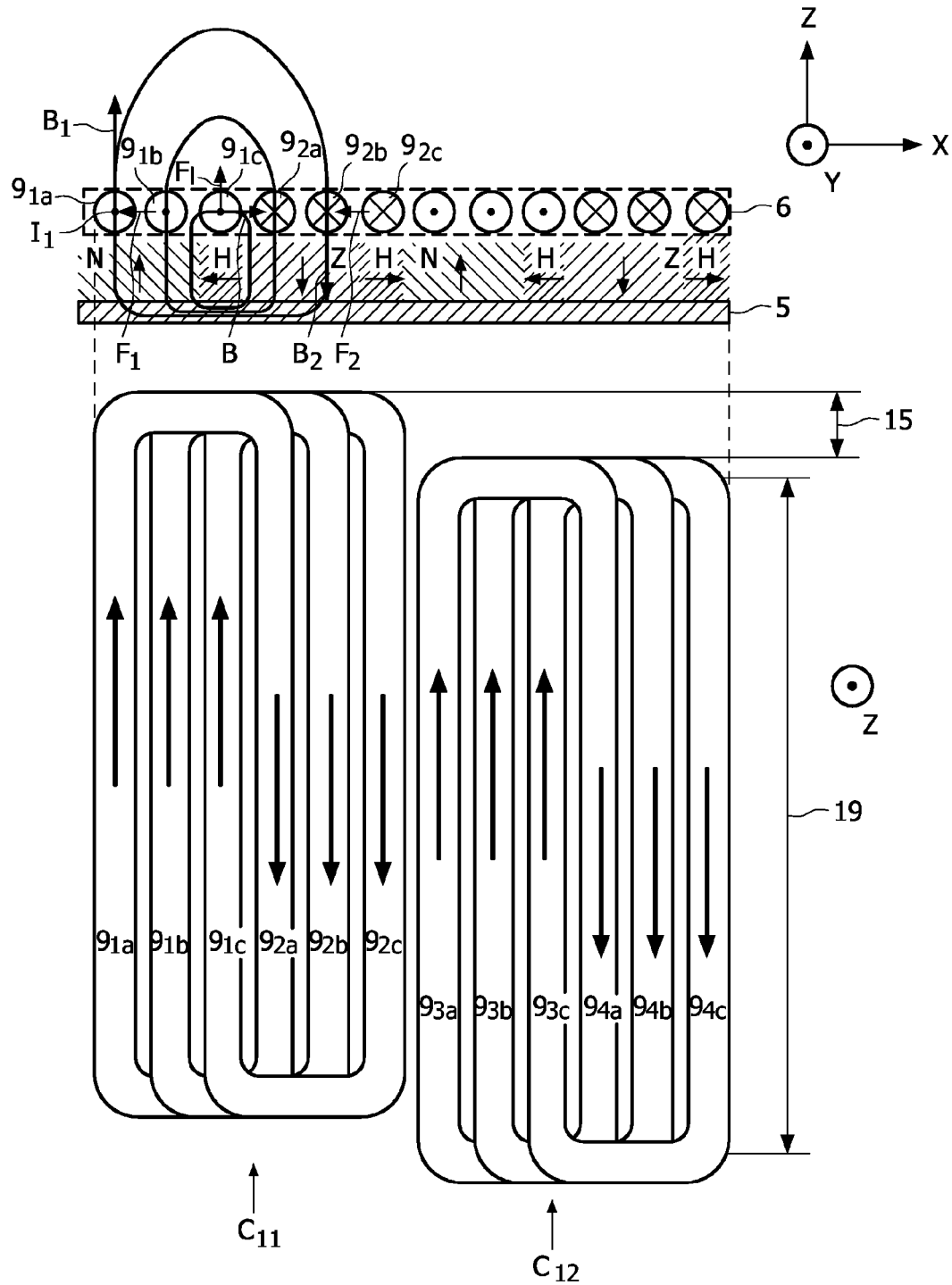
FIG. 3 is a cross-sectional view of the displacement device shown in FIG. 1.

Parts 11 of current conductors 9, 10 are also present above the magnets of the third type H and/or above parts where there is no magnet, i.e. between the magnets of the first type N and the second type Z (see FIG. 2, bottom left). These parts of the current conductors are situated in a magnetic field B whose average direction extends substantially parallel to the X-Y plane. Reference is also made to current conductor $9_{1c}$ in FIG. 3. If a current I runs through this current conductor, the above-mentioned parts of the current conductor will be subject to a force F in a direction perpendicular to the X-Y plane, i.e. the Z-direction. Dependent upon the direction of the current and the position of the current conductor with respect to the magnets, the force will be directed towards the magnets or away from the magnets. If the force is directed away from the magnets, then this force is referred to as the levitation force $F_l$, i.e. a force causing the current conductor to move away from the magnets. Such a force can be used to provide a bearing function between the coil block and the magnets.

The magnets of the first type N and the second type Z are square in shape. The magnets of the third type H are rectangular and dimensioned so that (see FIG. 2) the longest side faces 12 of a H magnet border on the side faces 13 of an N magnet and a Z magnet, and the ratio between the dimension of the shortest side face 14 and the dimension of the longest side face 12 of a H magnet lies in the range between 0.25 and 0.50. This results, as has been found in an optimization analysis, in the greatest strength of the magnetic field per unit area of the magnet system.

FIG. 3 shows two sets of three coils, i.e. a first set $C_{11}$ with current conductors $9_{1a}, 9_{1b}, 9_{1c}$ and return current conductors $9_{2a}, 9_{2b}, 9_{2c}$, and a second set $C_{21}$ with current conductors $9_{3a}, 9_{3b}, 9_{3c}$ and return current conductors $9_{4a}, 9_{4b}, 9_{4c}$. Both sets of coils are fed by a three-phase current system. Viewed in the longitudinal direction of the current conductors, the first set $C_{11}$ of three current conductors is shifted over a distance 15, which is approximately half the pole pitch 16 of the magnets, with respect to the second set $C_{21}$ of three current conductors. The pole pitch 16 of the magnets is to be taken to mean herein the distance between two adjacent diagonal lines on which the center points 17 and 18 of magnets of the same type, respectively, N and Z are situated, and is also called. If this measure is not taken, a variable torque is exerted on both sets of current-carrying coils during the displacement, which torque causes a kind of oscillating movement of the moving part (coil block or carrier with magnets) around the Z-axis with respect to the stationary part. By virtue of the displacement of the sets of coils with respect to each other, this oscillating effect is substantially reduced because a torque develops in one of the two sets of coils, which compensates for the torque in the other set. In a displacement device according to the invention, this oscillating effect could induce vibrations in the coil block 6.

The length 19 of the current conductors is chosen to be such that it is approximately equal to k times the pole pitch 16 of the magnets, k being a multiple of 2. As a result, upon a movement of the current conductor in the longitudinal direction the sum of the magnetic field remains approximately constant. This causes fluctuations in the force exerted on the current conductor to be smaller. This application is not dependent on the umber of coils and phases.

Figure 4A:
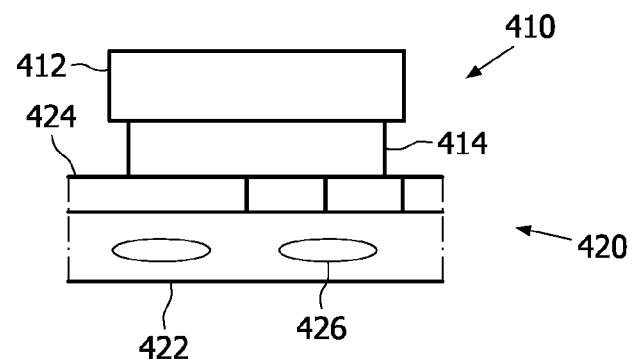
FIGS. 4a,b are schematic views of a displacement device according to the invention.
Figure 4B:
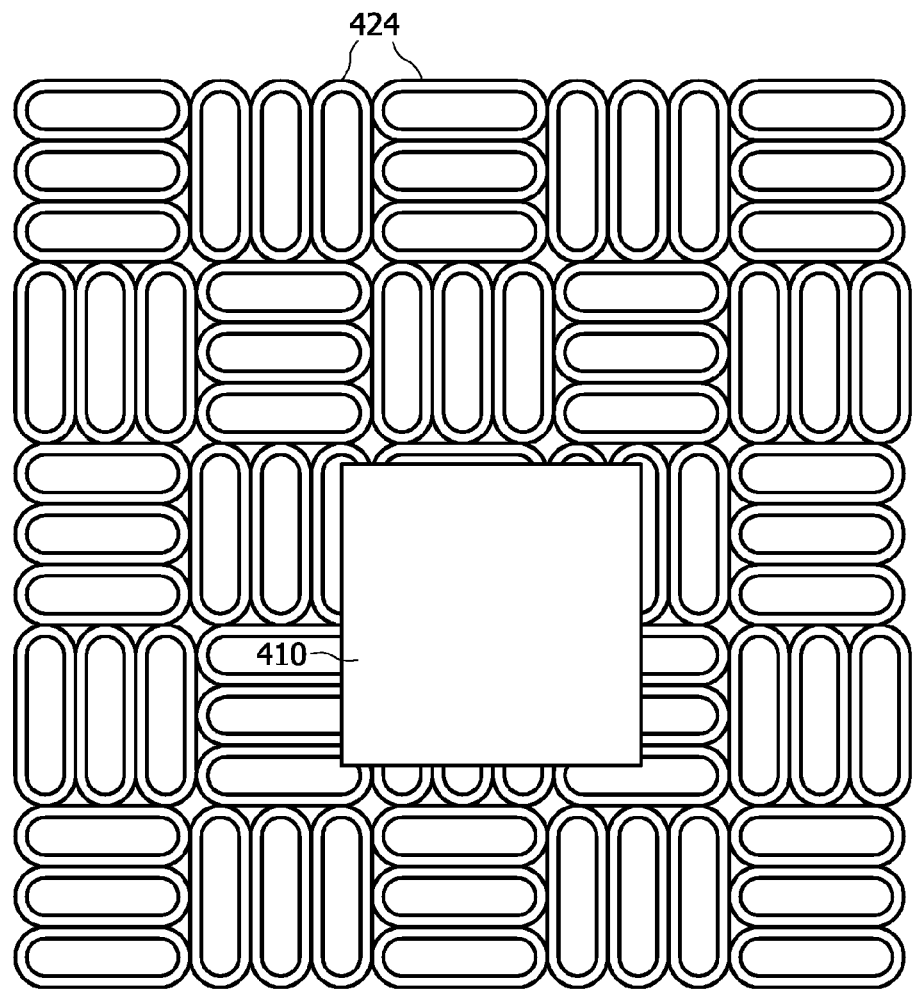

FIGS. 4a,b show a displacement device 1 according to the present invention with a first part or moveable magnet part 410 and a second or stationary coil part 420 (FIG. 4a as cross-section, FIG. 4b as top view). The magnet part 410 of the present example has a carrier 414 with in FIG. 4 invisible magnets and on top of the carrier 414 a mirror block 412, on which one or more mirrors and/or other optical elements are fixed as part of the interferometer system (not shown in FIG. 4) for high precision measuring of the magnet part's position. The magnet part 410 can move with respect to the stationary coil part 420. The coils 424 are arranged on a coil block 422 that is fluid-cooled via the cooling channels 426. As can be seen in FIG. 4, the coils 424 are arranged in groups of three with the orientation of neighboring groups being offset by 90°. The person skilled in the art will notice that other arrangements, such as groups of more or less than three coils, are possible as well.

Figure 5:
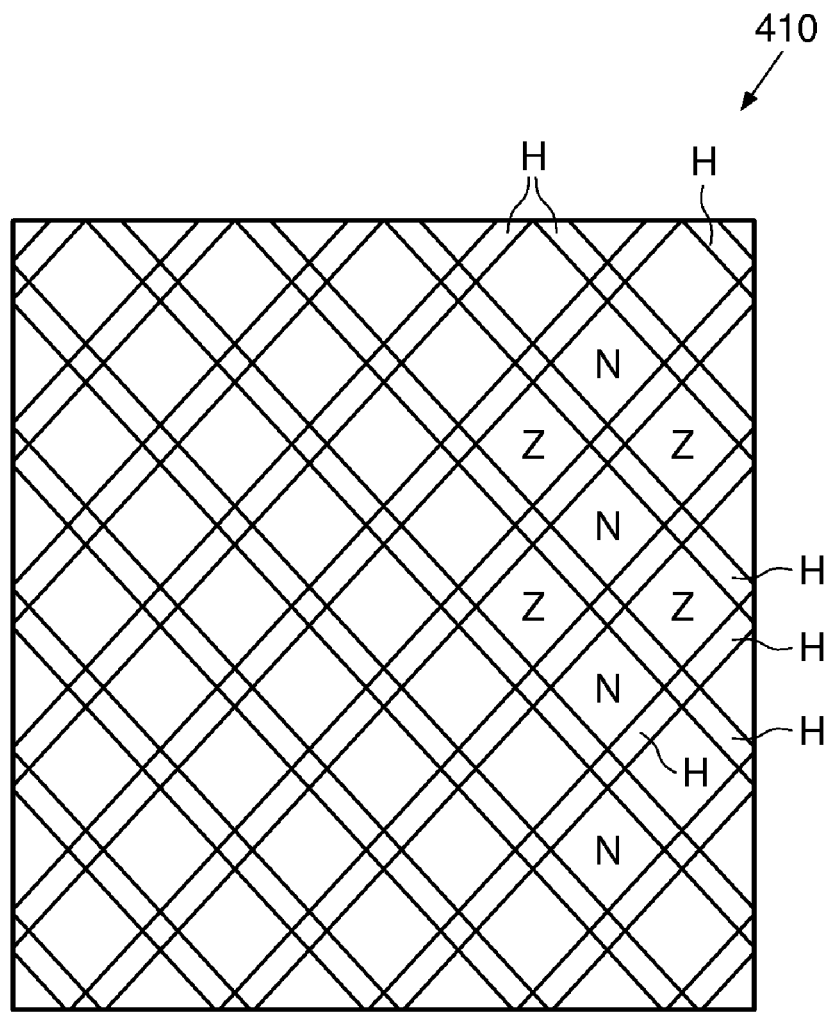
FIG. 5 is a schematic view of the magnet part of the displacement device of FIG. 4.

FIG. 5 shows more in detail the magnet part 410 flipped downside up. Three types of magnets N, Z and H are arranged like explained with FIG. 1.

FIG. 6 shows a displacement device 601 according to prior art in dual-stage configuration. The first stage for long range strokes comprises coils 612 moveable relatively to a magnet plate 610 and fixed to a long stroke carrier 614. The long stroke carrier 614 contains cooling facilities and electronic components for commuting the coils 612. For providing current, controlling signals and coolant fluid, the long stroke carrier 614 is attached to a cable arm 632. The cable arm 632 limits the range of movement of the displacement device 601. Beside, the cables of the cable slab 632 can disturb the interaction between magnets and coils, because they have magnetic field as well.

On the long stroke carrier 614 coils 622 are fixed that are part of the short stroke stage. The short stroke carrier 624 with magnets 620 is moveable relatively to the coils 622 and the long stroke carrier 614. The positioning of the short stroke stage is controlled with the help of an interferometer system, two light beams 630 of it are shown in FIG. 6.

The complexity of the displacement device 601 of FIG. 6 is quite high as not only one, but two stages have to be moved and positioned, controlled and cooled. It can be used in semiconductor industry for transporting wafers 20, e.g. in wafer steppers used for lithography, where high precision accuracy is very important.

In contrast, FIG. 7 shows a displacement device 701 according to the present invention for use e.g. in a wafer stepper. Only one stage is needed, with magnets 710 attached to carrier 714 and movable relatively to the coil plate 712. The necessary forces for providing a sufficient acceleration are provided by the special magnet arrangement comprising a Halbach magnet arrangement as explained above. The movement is neither limited nor disturbed by any cables or hoses. The carrier 714 is thermally and electromagnetically isolated and therefore does not influence in any way the object to be displaced, e.g. a wafer 20. The accuracy in positioning is achieved thanks to the interferometer control unit 731 with light beams 730. The interferometer control unit 731 contains a light source and detectors relayed to a processing unit for analyzing the measured data for determining the position of, in this example, the wafer 20. A light beam 730 is reflected on the vertical side of the carrier 714 and compared to a reference beam by the interferometer control unit 731 for measurement of position. Having less moving components than according to prior art increases reliability of the displacement device 701.

Figure 8:
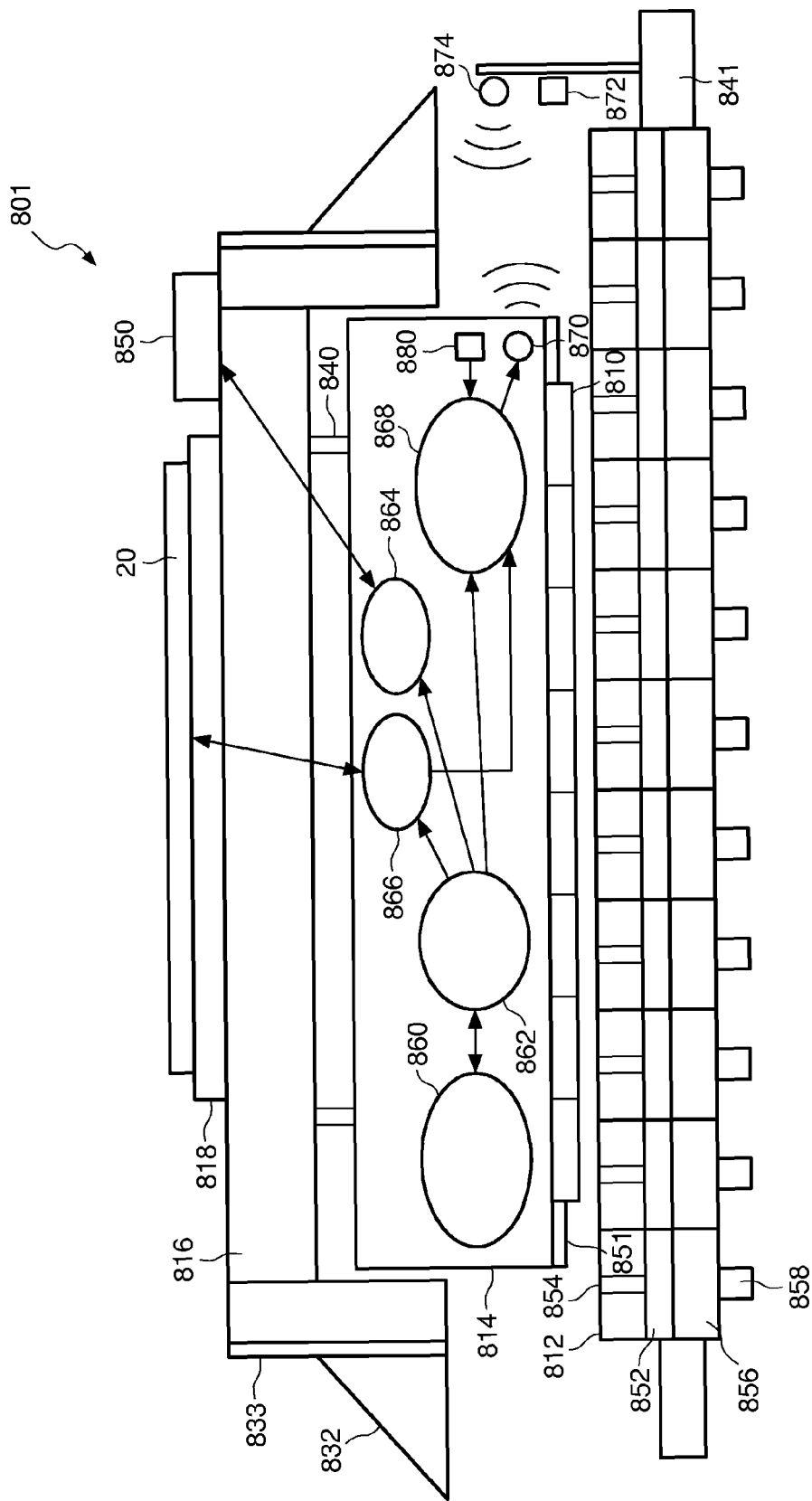
FIG. 8 is a more detailed cross-sectional view of a displacement device according to the invention.

FIG. 8 shows more in detail a displacement device 801 according to the invention for use in a wafer stepper. The main parts are again an arrangement of coils 812 that is stationary and an arrangement of magnets 810 to be moved with respect to the coils 812, both arrangement as previously explained.

The coils 812 are arranged in a table 841. In the middle of each coil 812 is a Hall sensor array 854 coupled with its amplifier 856 and Hall electrode 858 for measuring the position of the magnets 810 with respect to the coils 812. Depending on the position, the force level and force direction, current is led through coils overlapping with the magnets. The coils 812 are cooled by cooling bodies 852 directly beneath the coils 812.

The power for the electronics in and on the carrier 814, respectively mirror block 816 is picked up by the pick-up coils 851.

The carrier 814 and the mirror block 816 are decoupled with respect to vibration and heat by elastic elements, in this example leaf springs 840. The carrier contains most of the electronics whereas the mirror block carries a clamp 818 with a wafer 20 clamped on it. It further carries a calibration unit 850 for calibrating and checking the right position of the lithography exposure beam. For reflecting the interferometer probing beam prisms 832 and mirrors 833 are attached to the vertical sides of the mirror block 816.

The clamp 818 and the calibration unit 850 are controlled by the calibration electronics 864 and the clamp electronics 866. The calibration and clamp electronics 864, 866 are powered by the pick-up coil 852 and/or the power storage 860 after a power electronics 862, depending on the need. The calibrating and clamp electronics 864, 866 are relayed to the communications electronics 868. Via receiver 876 and emitter 870 in the carrier 814 and receiver 872 and emitter 874 outside, the communication electronics exchanges control data of and for the clamp the calibration and the displacement device with an external control unit. The communication electronics 868 is powered like the clamp and calibration electronics 864, 866. In the present example, the wireless communication means are optical, the senders 870, 874 being light emitting diodes and the receiver 872, 876 being photodiodes. It will be noted that it is possible as well to communicate using only the pick-up coils 851.

Because of having encapsulated the electronic components, it is possible to use the displacement device 801 in vacuum.

Figure 9:
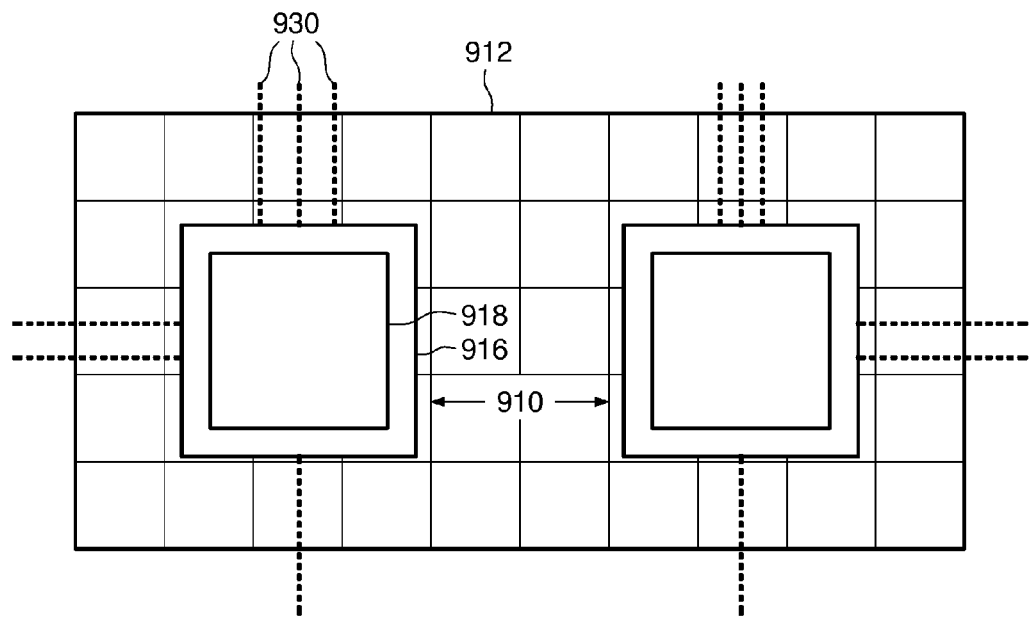
FIG. 9 is a schematic top view of another embodiment of a displacement device according to the invention in a first position.

FIG. 9 shows a displacement device having not only one, but two magnet parts 910 to be moved with respect to the coil plate 912, as so-called twin-stage configuration. In this top view only the wafer clamp 918 and the mirror block 916 of the magnet parts 912 are visible. As not only the position in space with respect to X-, Y-, and Z-direction is to be controlled, but also the tilt with respect to the X-, Y- and Z-axes, six probing beams 930 are provided by the interferometer system for each magnet part 910.

It will be noted that a displacement device with only one magnet part can have six degrees of freedom, too, as well as displacement devices with more than two magnets parts (six degrees of freedom per magnet part).

Figure 10:
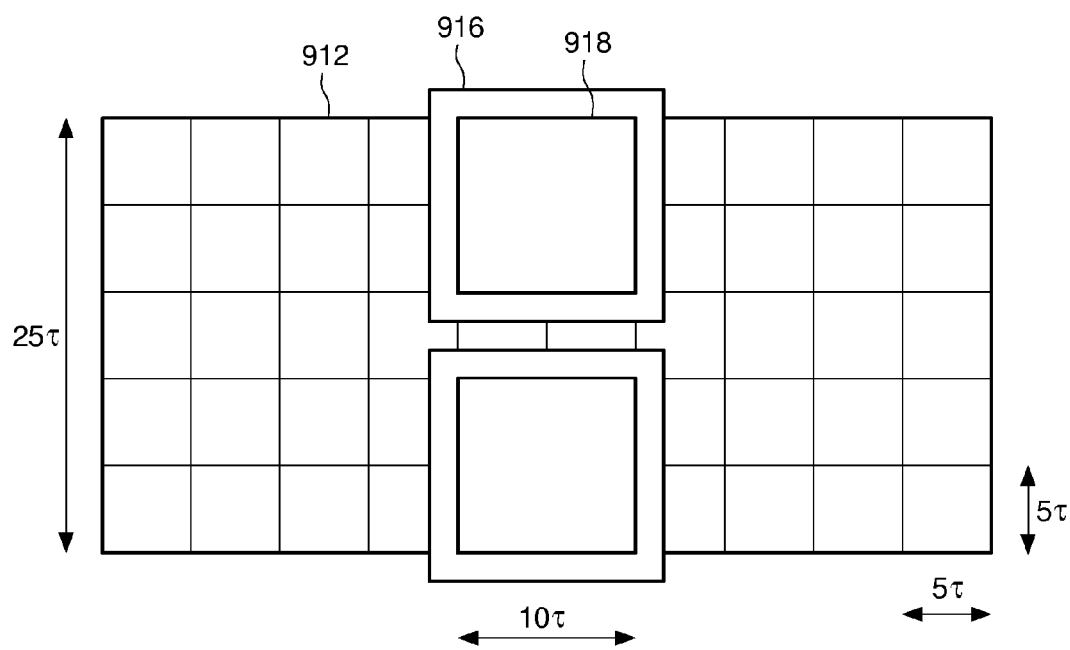
FIG. 10 is a schematic top view of the displacement device of FIG. 9 in a second position.

This twin-stage configuration is very convenient in the semiconductor industry. For example, the wafer on the left magnet part 910 can be measured, while the wafer on the right magnet part 910 can be simultaneously exposed to the projection beam of a lithography apparatus. The swapping of position of both magnet parts 910 is shown in FIG. 10. Compared to prior art dual stage configuration with moving coil part attached to cable and hose arm, the swap time is reduced as all these impediments need not to be taken into account.

As can be taken from FIGS. 9 and 10, the interferometer system needs not to be measuring continuously. For most applications it is sufficient to measure only during fine positioning of the magnet parts 910.

The dual stage displacement device illustrated in FIGS. 9 and 10 has the following dimensions: The length of the mirror block 916 is 420 mm. The minimum space between both magnet parts 910 during swapping (see FIG. 10) is 50 mm. If one takes one square of the coil plate 912 to be a group of three coils as shown in FIG. 4 and equivalent to 5 magnetic pitches, and the length of the mirror block to be equivalent to two and a half coil groups, equivalent to 15, the magnetic pitch is 31.8 mm.

Figure 11:
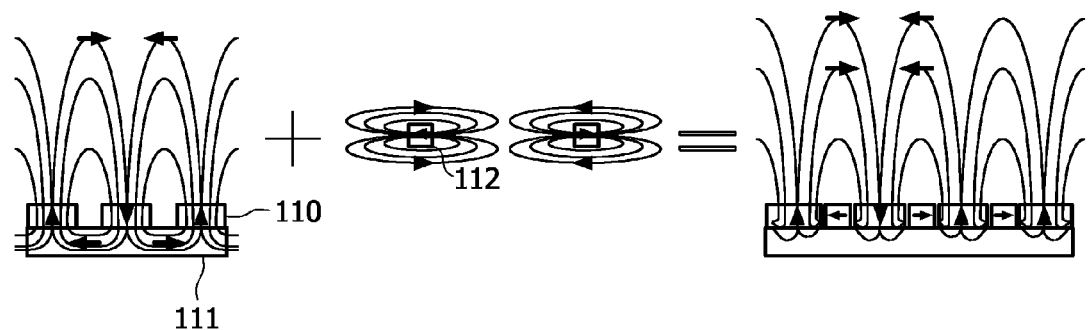
FIG. 11 illustrates a special feature of the magnet part of the displacement device according to the invention.
Figure 12:
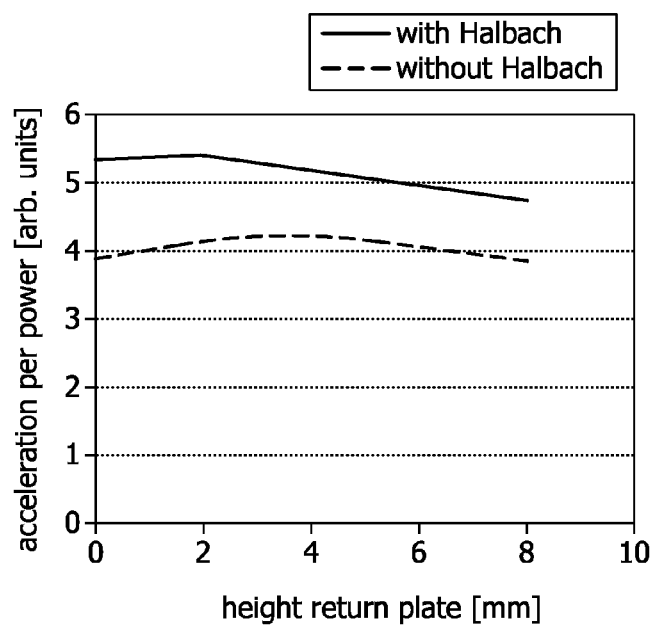
FIG. 12 is a plot of acceleration per power versus the height of the return plate.

FIG. 11 shows magnets 110 of type N and Z arranged on a return plate 111. The return plate returns the magnetic flux to the magnets 110. If one adds Halbach magnets 112 in between the magnets 110 the magnetic flux is modified such that much less flux exits the magnets 110 on the return plate side. This effect is shown in FIG. 12 as well. The acceleration per power versus the height of the return plate has been measured with Halbach magnets and without Halbach magnets. Without Halbach magnets, the acceleration per power is increased by increasing the height of return plates from 0 mm to almost 4 mm. With Halbach magnets, from ca. 2,5 mm to no return plate at all, the acceleration per power remains constant. If some parameter can be improved by reducing the weight of the magnet part by even omitting a return plate, there is no negative impact on the acceleration per power. It will also be noted, that by using Halbach magnets there is a general increase in acceleration per power of ca. 25% and more for lower return plate heights compared to magnet arrangements without Halbach magnets.

Figure 13:
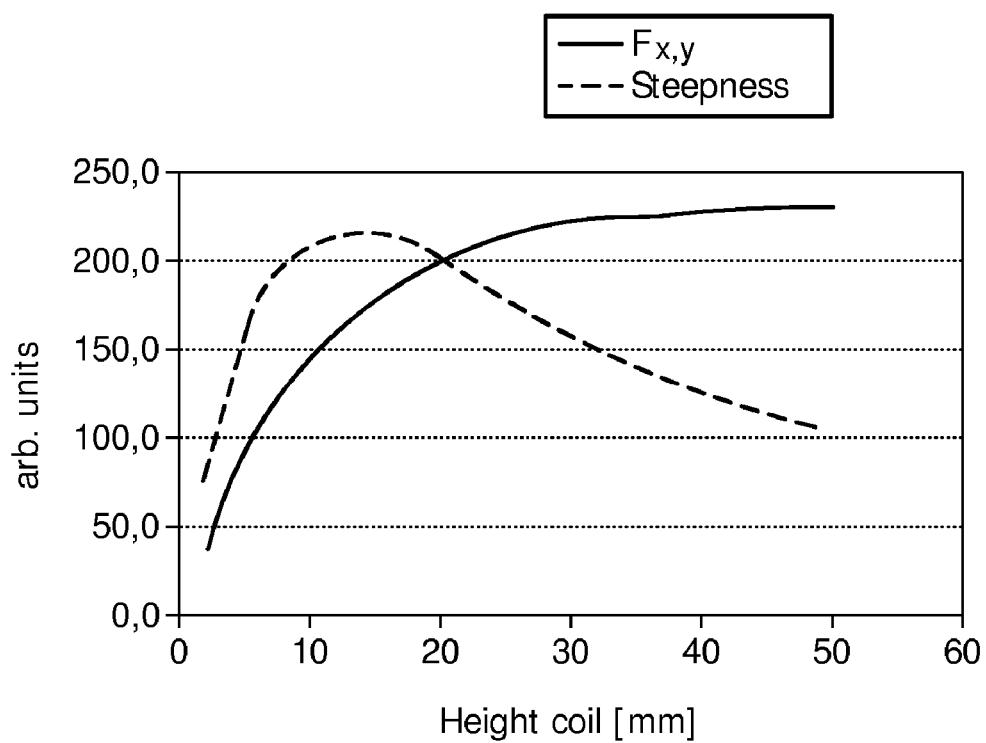
FIG. 13 is a plot of force and steepness versus the height of the coils.

Another parameter for optimizing the displacement device according to the present invention is shown in FIG. 13. The force in the plane of movement, the X-Y-plane, as well the steepness have been measured for varying coil heights with the device shown in FIGS. 9 and 10. As can be seen from the graph, an optimum combination of high force and high steepness can be achieved for heights between ca. 5 mm and 30 mm, better between 9 mm and 25 mm, the optimum for the measured device being around 22 mm.

Although having described several preferred embodiments of the invention, those skilled in the art would appreciate that various changes, alterations, and substitutions can be made without departing from the spirit and concepts of the present invention. The invention is, therefore, claimed in any of its forms or modifications with the proper scope of the appended claims. For example various combinations of the features of the following dependent claims could be made with the features of the independent claim without departing from the scope of the present invention. Furthermore, any reference numerals in the claims shall not be construed as limiting scope.

LIST OF REFERENCE NUMERALS:

1 first part
2 second part
3 magnet system
4 electric coil system
5 carrier
6 coil block
7 rows
8 columns
N magnet of first type
Z magnet of second type
H magnet of third type
$C_1$ coil of first type
9, $9_1$, $9_2$ current conductor
$C_2$ coil of second type
10, $10_1$, $10_2$ current conductor
B, $B_1$, $B_2$ magnetic field
$I_1$, $I_2$, $I_3$, $I_4$ electric current
$F_1$, $F_2$, $F_3$, $F_4$ force
12 side face
13 side face
$C_{11}$, $C_{22}$ set of coils
$9_{1a}$, $9_{1b}$, $9_{1c}$, $9_{2a}$, $9_{2b}$, $9_{2c}$ current conductors
$9_{3a}$, $9_{3b}$, $9_{3c}$, $9_{4a}$, $9_{4b}$, $9_{4c}$ current conductors
15 distance
16 pole pitch
17 center point
18 center point
19 length
401 displacement device
410 magnet part
412 mirror block
414 carrier
420 coil part
422 coil block
424 coil
426 cooling channel
601 displacement device
610 magnet plate
612 coil
614 long stroke carrier
620 magnet
622 coil
624 short stroke carrier
630 interferometer light beam
632 cable slab
20 wafer
701 displacement device
710 magnet
712 coil plate
714 carrier
730 interferometer light beam
731 interferometer control unit
801 displacement unit
810 magnet
812 coil
814 carrier
816 mirror block
818 wafer clamp
832 prism
833 mirror
840 spring
841 table
850 calibration unit
851 pick-up coil
852 cooling body
854 Hall sensor array
856 amplifier
858 Hall electrode
860 power storage
862 power conditioning
864 calibration electronics
866 clamp electronics
868 communication electronics
870 emitter
872 receiver
874 emitter
876 receiver
912 coil plate
916 mirror block
918 clamp
930 interferometer light beam
110 N and Z-type magnets
111 return plate
112 H-type magnets

The invention claimed is:

1. A displacement device comprising a first part and a second part which can be displaced with respect to each other in at least an X-direction and a Y-direction perpendicularly thereto, the first part comprising a carrier which extends substantially parallel to the X-direction and the Y-direction and on which a system of magnets is secured in accordance with a pattern or rows extending parallel to the X-direction, and columns extending parallel to the Y-direction, an equal distance being present between the rows and between the columns, and magnets of a first type, having a magnetization direction which extends at right angles to the carrier and towards the second part, and magnets of a second type, having a magnetization direction which extends at right angles to the carrier and away from the second part, being alternately arranged in each row and in each column, and a magnet of a third type being arranged in each column between each pair of juxtaposed magnets of the first and the second type, which magnet of a third type has a magnetization direction which extends parallel to the Y-direction and towards the magnet of the first type, while the second part is provided with a single layer electric coil system comprising a plurality of groups of at least one electric coil of a first type which has current conductors which are situated in a magnetic field of the system of magnets and which include an angle of substantially 45° with the X-direction, and comprising a plurality of groups of at least one electric coil of a second type, which has current conductors which are also situated in the magnetic field of the system of magnets and which include an angle of substantially 45° with the X-direction, and said current conductors of the second type extending perpendicularly to the current conductors of the first electric coil, wherein in each row of the magnets of the first part, also a magnet of the third type is arranged between each pair of juxtaposed magnets of the first and the second type, which magnet of the third type has a magnetization direction extending parallel to the X-direction and towards the magnet of the first type, wherein the second part is stationary and the first part is movable relative to the second part over a range of centimeters, wherein the displacement device further comprises an interferometer system for accurate positioning of the movable first part, wherein the displacement device is characterized in that the magnets of the first and the second type have an identical square shape with side faces, in that the magnets of the third type are rectangular in shape with side faces, whereby the longest side faces of a magnet of the third type border on the side faces of a magnet of the first and the second type and are just as long as the side faces of the magnet of the first and second type; wherein the first part further comprises a mirror block and a pick-up coil, and power for the carrier is picked up by the pick-up coil, and wherein the carrier and the mirror block are decoupled with respect to vibration and heat by elastic elements.

2. The displacement device according to claim 1, wherein the ratio of the dimension of the shortest side face of a magnet of the third type to the dimension of the longest side face ranges between 0.25 and 0.50.

3. The displacement device according to claim 1, wherein the length of the current conductors of the coils, which current conductors are situated in the effective magnetic field, is approximately equal to k times the pole pitch of the magnets, with k being 2,4,6,..., and the pole pitch of the magnets being defined as the distance between two adjacent diagonal lines on which the center points of magnets of the same type are situated.

4. The displacement device according to claim 1, wherein the first part further comprises a return plate of a height of approximately 5 mm or less, preferably approximately 3 mm or less.

5. The displacement device according to claim 1, wherein the coil height is between approximately 15 mm and 30 mm, preferably between approximately 19 mm and 23 mm.

6. The displacement device according to claim 1, wherein a Hall sensor is placed in the middle of a coil.

7. The displacement device according to claim 1, wherein a component of the interferometer system is a mirror and/or a prism on a vertical side of the first part for reflecting a light beam of the interferometer system.

8. The displacement device according to claim 1, wherein the first part has means for wireless data communication.

9. The displacement device according to claim 1, wherein the displacement device comprises more than one first part.

10. The use of a displacement device according to claim 1 in a planar electric motor with six degrees of freedom.

11. The displacement device according to claim 1, further comprising a third part, the third part comprising a carrier which extends substantially parallel to the X-direction and the Y-direction and on which a system of magnets is secured in accordance with a pattern or rows extending parallel to the X-direction, and columns extending parallel to the Y-direction, an equal distance being present between the rows and between the columns, and magnets of a first type, having a magnetization direction which extends at right angles to the carrier and towards the second part, and magnets of a second type, having a magnetization direction which extends at right angles to the carrier and away from the second part, being alternately arranged in each row and in each column, and a magnet of a third type being arranged in each column between each pair of juxtaposed magnets of the first and the second type, which magnet of a third type has a magnetization direction which extends parallel to the Y-direction and towards the magnet of the first type, the third part movable relative to the second part.

* * * * *